United States Patent
Lai et al.

(10) Patent No.: US 7,501,212 B2
(45) Date of Patent: Mar. 10, 2009

(54) METHOD FOR GENERATING DESIGN RULES FOR A LITHOGRAPHIC MASK DESIGN THAT INCLUDES LONG RANGE FLARE EFFECTS

(75) Inventors: Kafai Lai, Poughkeepsie, NY (US); Chieh-Yu Lin, Hopewell Junction, NY (US); Nayak Jawahar, Wappingers Falls, NY (US); Mukherjee Maharaj, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 704 days.

(21) Appl. No.: 11/029,884

(22) Filed: Jan. 5, 2005

(65) Prior Publication Data

US 2006/0150131 A1 Jul. 6, 2006

(51) Int. Cl.
*G03F 9/00* (2006.01)
(52) U.S. Cl. ................................ 430/5; 716/19; 716/21
(58) Field of Classification Search ...................... 430/5; 716/19, 21
See application file for complete search history.

(56) References Cited

U.S. PATENT DOCUMENTS 6,329,107 B1 * 12/2001 Lu ................................ 430/5
7,131,104 B2 * 10/2006 Gallatin et al. ................ 716/19
7,155,689 B2 * 12/2006 Pierrat et al. ................... 716/4
2003/0068565 A1 * 4/2003 Ki et al. .......................... 430/5
2005/0055658 A1 * 3/2005 Mukherjee et al. ............ 716/19

* cited by examiner

*Primary Examiner*—Mark F Huff
*Assistant Examiner*—Rashid Alam
(74) *Attorney, Agent, or Firm*—H. Daniel Schnurmann (57) ABSTRACT

A method is described for computing distance based and pattern density based design rules for the mask layout design of a VLSI chip so that the design satisfying the above design rules when manufactured on a wafer do not violate the specified tolerance on the critical dimensions (CD). The design rules are developed on the computed enclosed energy which is a convolution of the total optical energy and the pattern density of the mask. The total optical energy is the sum of the short range diffraction limited optical energy and the long range optical flare. The method steps for generating rules for a mask layout include: selecting a mask shape from a plurality thereof inputted from the mask layout, and determining a CD of the selected mask shape and a tolerance on variations of the CD; building a physical model of a component of the energy contributed by surrounding regions at a predetermined distance from the CD; using the physical model, computing the energy enclosed within the surrounding regions at the predetermined distance, and the maximum pattern density there of while remaining within the tolerance on variations of the CD; and outputting the maximum pattern density as a rule for the surrounding region at that distance.

20 Claims, 10 Drawing Sheets

METHOD FOR GENERATING DESIGN RULES FOR A LITHOGRAPHIC MASK DESIGN THAT INCLUDES LONG RANGE FLARE EFFECTS

BACKGROUND OF THE INVENTION

This invention relates generally to the design of Very Large Scale Integrated Circuit (VLSI) chips, and more particularly, to a method for generating design rules in a chip layout that incorporates the effect of long-range flare in an optical micro-lithography process.

The optical micro-lithography process used in semiconductor fabrication, also known as photolithography, consists of duplicating selected circuit layout patterns onto a semiconductor wafer for an overall desired circuit performance. The desired circuit patterns are typically represented as opaque, complete and semi-transparent regions on a template commonly referred to as a photomask. In optical micro-lithography, patterns on the photo-mask template are projected onto the photo-resist coated wafer by way of optical imaging through an exposure system.

The continuous advancement of VLSI chip manufacturing technology to meet Moore's law of shrinking device dimensions in geometric progression has created several design restrictions for manufacturing semiconductor chips using optical micro-lithography process. The latter is the method of choice for chip manufacturers for the foreseeable future due to its high volume yield in manufacturing and past history of success. However, the ever shrinking device dimensions combined with the desire to enhance circuit performance in the deep sub-wavelength domain require complex design rules to ensure the desired circuit performance on a printed wafer.

A typical lithographic mask has two types of regions. They are referred to as the chrome region and the clear region. Chrome regions are opaque regions that prevent the transmission of light, whereas clear regions are transparent regions that allow the transmission of light. The pattern density of a given mask region is defined as the percentage of that region that is covered by the chrome region. The effect of flare at a particular shape on the mask due to flare emanating from all the shapes on the mask can be computed using the shape pattern density in a given region on the lithographic mask.

There are certain masks where the amount of light emanating from the mask can be controlled by changing the phase and the intensity of the light emanating from the clear or the chrome regions. In these masks, the amount of light emanating from the mask is determined by the interaction of the phase and intensity of light emitted from the chrome and the clear regions. In this type of masks, the pattern density can be defined in terms of the amount of light emanating from a given region of the mask. For this type of masks, the flare is preferably computed in terms of the pattern density.

Design rules, also referred to as 'restrictions' embody the limitations of the optical micro-lithography process when manufacturing a chip layout. A VLSI circuit layout must obey design rules to be manufactured within the tolerance of process variation in the optical micro-lithography system. Examples of design rules are minimum width of a channel, minimum distance between two corners, minimum distance between two features, and the like. Examples of design rules are illustrated in FIG. 1.

Figure 1:
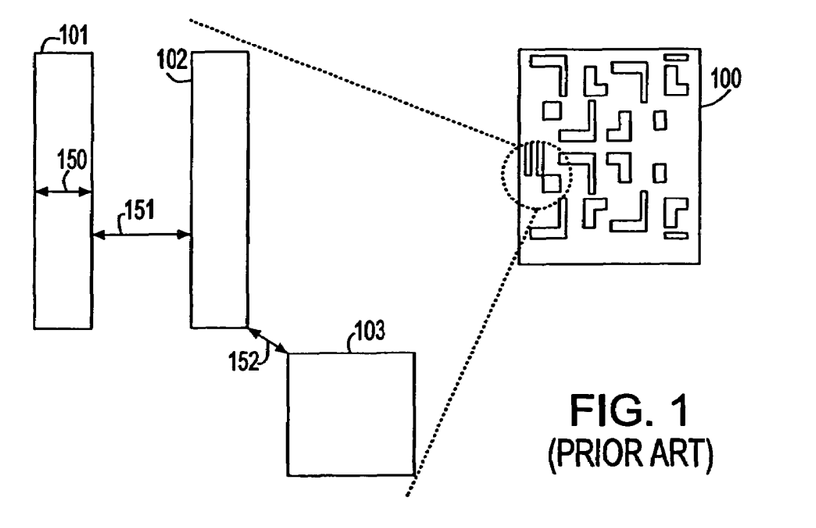

Referring to FIG. 1, a portion of a mask layout 100 that contains several polygonal shapes is shown. Several shapes, e.g., 101 through 103 are depicted in detail at the left of the figure. More specifically, 150 represents the line width, 151 depicts the space width and 152, the corner to corner distance between the shapes. The minimum and maximum values of 151 through 152 are determined by the specifications of the design rules.

A VLSI circuit consists of several layers overlaid on top of one another. The chip operates properly only if each of the layers operates properly. Each layer is manufactured using an optical lithography process that is suited for the particular layer. For each layer, a set of design rules is generated by process engineers, considering the limitations of the particular optical micro-lithography process used. Designers of the VLSI circuit ensure that the circuit, while it is designed, obeys the stated rules. Finally, the circuit is tested by way of a Design Rule Checker (DRC) for any violations of the design rules before it is handed over to manufacturing.

Figure 2:
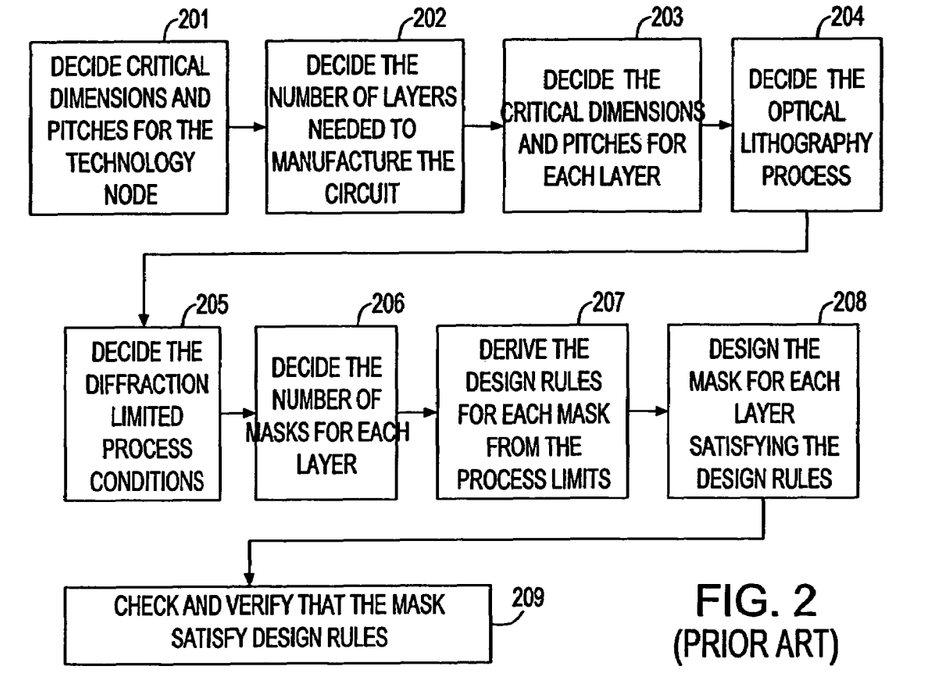
FIG. 2 is a flow chart showing a prior art method for computing and verifying design rules for different masks for an optical lithography process.

The aforementioned methodology is illustrated in FIG. 2. In step 201, the critical dimensions and the pitches of the shapes are decided upon based on the technology. By way of example, the current state of the art technology that is presently manufactured, require a 90 nm gate width. The circuit consists of several layers of materials. The bottom most layers in a typical VLSI circuit consists of a large number of transistors. The transistors are made of at least two layers. These are, in turn, connected to one another by several layers of metal interconnects. Each layer of metal is interconnected by via layers. In step 202, the number of layers for the circuit to be manufactured is determined. Each layer has its own critical dimensions and pitches, which are decided in step 203. These dimensions in turn depend on the critical dimensions of the circuit, as specified in step 201. Since each layer is fabricated in a predetermined order, the manufacturing process must also decide on the lithographic process to be used for each layer (step 204). In step 205, any limitation of the lithographic process for each layer is determined, and is followed by step 206, wherein the number of masks for each layer is defined. Usually, each layer requires simple chrome on a glass mask. However, occasionally, a layer can be manufactured using two or more masks. In step 207, the design-rules to be applied on the design for each mask are determined on the basis of the optical lithographic process. In step 208, the masks are designed in accordance with the prescribed design rules. In step 209, the masks are checked for violations of design rules before their release to manufacturing.

There are two major objectives that the design rules must satisfy. First, the design rules must not be overly restrictive, since overly restrictive design rules reduce the circuit performance. By way of example, if the specified minimum feature width within the design rule that is required for the circuit to function at a pre-specified speed is overly restrictive, then the circuit will, as a result, underperform.

Secondly, the design rules must ensure that the circuit to be manufactured remains within the tolerance of the process variation. Optical micro-lithography processes are subject to several variations. The yield of the process decreases drastically if the chip cannot be manufactured under these variations, making the manufacturing economically unattractive. Often these two objectives cannot be mutually satisfied. Accordingly, design rules are generated to balance the above two objectives.

In the current state of the art, the limitations of the optical micro-lithography process that are embodied in the design rules are caused by diffractions of light in the optical system and the ensuing chemical effect in the resist development process.

The success of the generating appropriate design rules under the two conflicting objectives often depends on the use of a highly accurate simulator to predict the lithographic processing effects on selected points on the mask shapes which, ultimately, are printed on the wafer. Based on the simulation, a modeled integrated circuit layout determines the overall printed image on the wafer by interpolating selected simulated points.

Aerial image simulators that compute the images generated by optical projection systems have proven to be a valuable tool for analyzing and improving state of the art optical lithography systems. These simulators have found wide application in advanced mask designs. Modeling aerial imaging is a crucial component of semiconductor manufacturing. The aerial image generated by the mask, i.e., the light intensity of an optical projection system image plane, is a critically important parameter in micro-lithography for governing how well a developed photo-resist structure replicates a mask design and which, generally, needs to be computed to an accuracy greater than 1%.

In the prior art, simulated physical effects include only the diffraction of light in the presence of low order aberrations, limiting the accuracy of the predictions. Practitioners of the art will readily recognize that physical effects may include all effects of mask processing such as optical, x-ray, chemical, etching and extreme ultra-violet ray processing.

A significant effect not currently included is the scattered light which affects the exposure over long distances on the wafer. Such long-range optical effects are generally referred to as "flare" in the literature. Given the current extremely tight requirements on Across-Chip-Line-Width-Variation (ACLV), flare effects need to be included. Also, in some cases, novel RET methods such as alternating Phase Shifting Masks (Alt-PSM) can exacerbate the problem by requiring dual exposure. The problem is even more pronounced in bright field masks that are used in printing critical levels and which control the ultimate performance of the circuit, such as gate and diffusion levels.

Accuracy is of critical importance in the computation of calibrated optical or resist models. The accuracy in the simulation of wafer shapes is necessary to gain a better understanding and provide an improved evaluation of the OPC methodologies. Through analytical processes, fidelity in the wafer shapes to the "as intended" shapes ultimately achieve a better correction of the mask shapes. An increase in yield at chip manufacturing is a direct consequence of achieving this accuracy.

A significant difficulty when taking into consideration long range effects, such as flare, is the extent of the corrections flare effects required on the mask. In the prior art, optical lens aberrations are modeled by just the 37 lowest order Zernikes and, therefore, only aberrations that deviate light by 1 micron or less are included. The effect of aberrations dies off within that range. The flare effect, on the other hand, extends up to a few mms, thus covering the entire chip area. Current Model-Based OPC (MBOPC) software tools are not equipped to handle such long distance effects.

Figure 3:
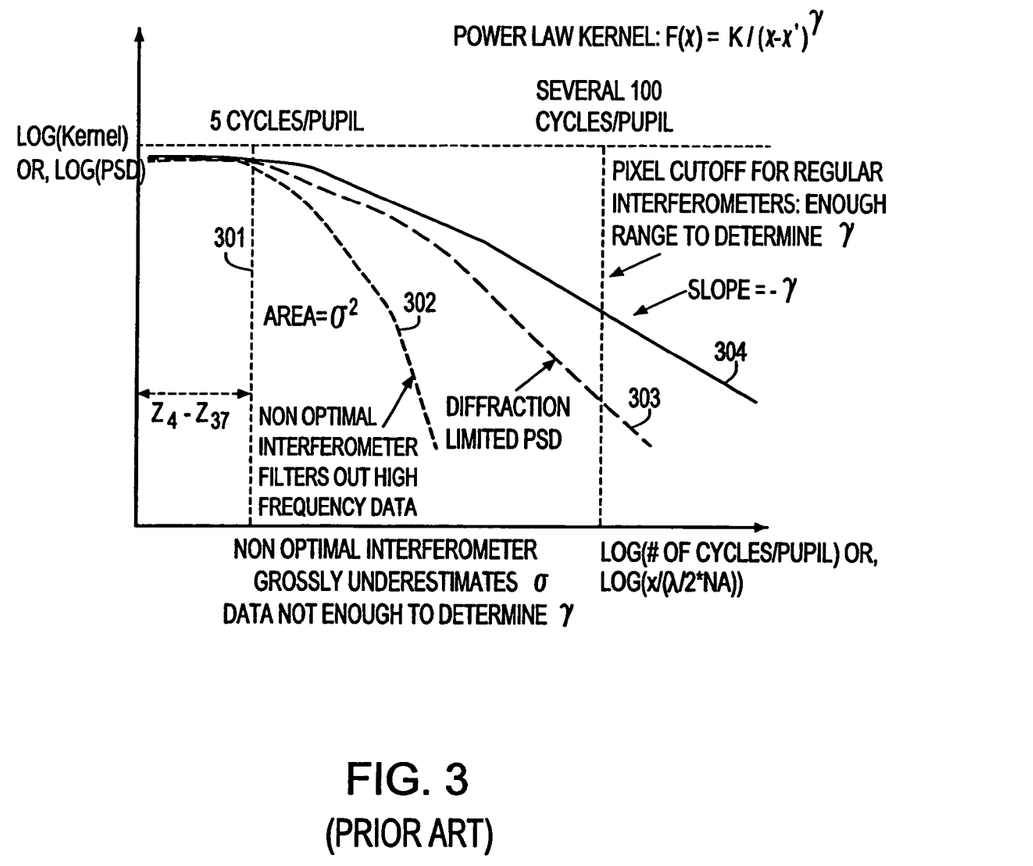
FIG. 3 illustrates the extent of the flare kernel and the power spectral density of flare accounting for the optical energy falling on the exposed mask plotted against the logarithmic distance from the mask opening.

The limitations of the current methodology are shown in FIG. 3. Therein is illustrated the extent of the flare kernel and the power spectral density of the flare accounting for the optical energy falling on the exposed mask, which is plotted against the logarithmic distance from the mask opening. The distance is measured in terms of the number of wave cycles/pupil or the distance $x/(\lambda/2*NA)$, wherein $\lambda$ is the wavelength of the light and NA, the numerical aperture. The limitations of the current art which are modeled by the 37 Zernike polynomial parameters $Z_4$ through $Z_{37}$ are shown in 301. On the other hand, the actual extent of the flare is shown in 304. The flare can be modeled by the Power Law $F(x)=K/(x-x')^{\gamma/2}$, wherein the constant $\gamma$ ranges from 1.5 to 3, depending on the optical system used in the lithographic process. The non-optimal interferometers used to measure the extent of flare are shown in 302. The non-optimal interferometer grossly underestimates the energy of the flare. On the other hand, a regular interferometer can be used to find the extent of the flare, as shown in 303.

In current MBOPC tools, interaction regions are in the order of 1 micron. Any increase in size of that region significantly affects the timing and accuracy of the simulation and, consequently, affects the OPC results. As a result, the need for fast and accurate flare modeling is being felt throughout the industry.

It has been shown through experimental data that the effect of flare on the variation of the Critical Dimension (CD) of transistors and other circuit devices can be as high as 6% of the designed dimensions for certain optical lithography process configurations. Therefore, it is imperative that these effects be considered in the simulation tools used by the MBOPC software.

Figure 4:
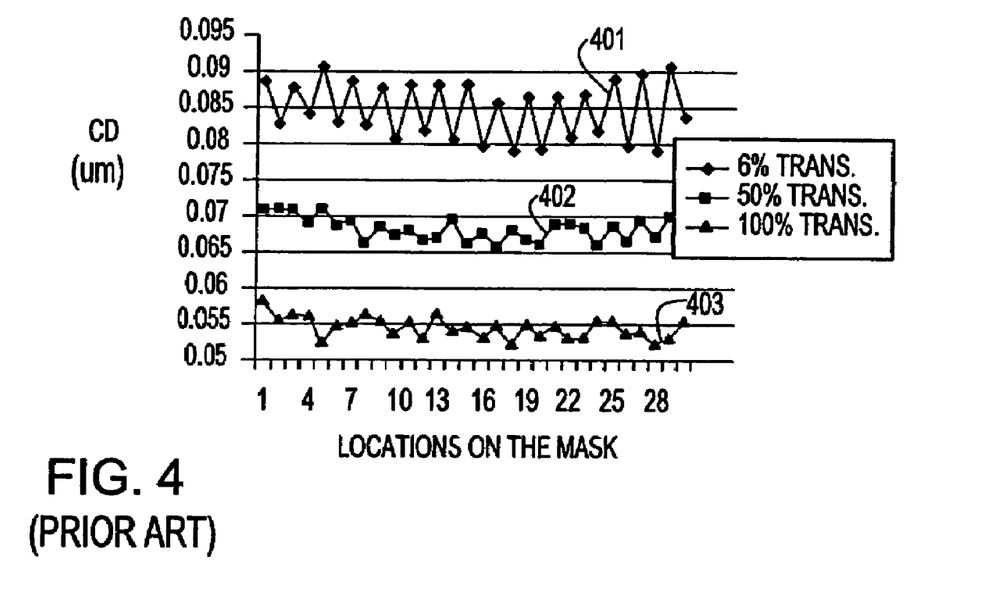
FIG. 4 is a graph plotting the variations of the critical dimension on a typical wafer to different transmissions for the same structure at different locations.

The experimental justification of flare is shown in FIG. 4. Therein, the same mask structure printed on several locations on the wafer is shown having three different neighborhood background transmissions. Measured CDs of different wafer site locations are plotted against different background transmissions. The CD with 6%, 50% and 100% neighborhood background transmissions are shown in 401, 402 and 403, respectively. It is observed that a CD having a 6% neighborhood background transmission shows more pronounced CD variations than other plots.

In the prior art, the following mathematical treatment in the optical proximity correction engine is commonly used. These approaches are in one form or another, related to the Sum of Coherent Source (SOCS) method, which is an algorithm for efficient calculation of the bilinear transform.

Sum of Coherent Systems (SOCS) Method

The image intensity is given by the partially coherent Hopkin's equation (a bilinear transform):

$$I_0(\vec{r})=\iiint d\vec{r}\,'dr''h(\vec{r}-\vec{r}\,')h^*(\vec{r}-r'')j(\vec{r}\,'-r'')m(\vec{r}\,')m^*(\vec{r}\,''),$$

where, h is the lens point spread function (PSF);
j is the coherence;
m is the mask; and
$I_0$ is the aerial image.

By using the SOCS technique, the optimal $n^{th}$ order coherent approximation to the partially coherent Hopkin's equation can be expressed as $$I_0(\vec{r}) \cong \sum_{k=1}^{n} \lambda_k |(m \otimes \phi_k)(x)|^2$$

where $\lambda_k, \phi_k(\vec{r})$ represents the eigenvalues and eigenvectors derived from the Mercer expansion of:

$$W(\vec{r}\,',r'') = h(\vec{r}\,')h*(r'')j(\vec{r}\,'-r'') = \sum_{k=1}^{\infty} \lambda_k \phi_k(\vec{r}\,')\phi_k(\vec{r}\,''),$$

suggesting that a partially coherent imaging problem can be optimally approximated by a finite summation of coherent imaging, such as linear convolution.

SOCS With Pupil Phase Error

The above calculation assumes an ideal imaging system. However, when a lens aberration is present, such as the pupil phase error and apodization, one must include the pupil function:

$$h(\vec{r}) = \int \int P(\vec{\rho}) \exp(i\, W(\vec{\rho})) \exp(i 2\pi \vec{r} \cdot \vec{\rho}) d^2\vec{\rho}$$

where, $P(\vec{\rho})$ is the pupil transmission function, and $W(\vec{\rho})$ is the pupil phase function, which contains both aberration and flare information.

Because of a possible higher spatial frequency in the wavefront function, $h(\vec{r})$ will have a larger spatial extent. In this case, the number of eigenvalues and eigenvectors required are higher than those of an ideal system. Hence, the kernel support area is extended to take into account the contribution from a distance greater than λ/NA. However, the basic mathematical structure and algorithm remains the same.

Physical Model of Flare

Flare is generally considered to be an undesired image component generated by high frequency phase "ripples" in the wavefront corresponding to the optical process. Flare thus arises when light is forward scattered by appreciable angles due to phase irregularities in the lens. An additional component of flare arises from a two-fold process of backscatter followed by re-scatter in the forward direction, as will be discussed hereinafter. High frequency wavefront irregularities are often neglected for three reasons. First, the wavefront data is sometimes taken with a low-resolution interferometer. Moreover, it may be reconstructed using an algorithm of an even lower resolution. Secondly, even when the power spectrum of the wavefront is known or inferred, it is not possible to include the effect of high frequency wavefront components on an image integral that is truncated at a short ROI (region of interaction) distance, causing most of the scattered light to be neglected. Finally, it is not straightforward to include these terms in the calculated image. The present invention addresses these problems.

Flare also arises from multiple reflections between the surfaces of the lens elements (including stray reflections from the mask and wafer). The extra path length followed by this kind of stray light usually exceeds the coherence length of the source, which means that ordinary interferometric instruments will not detect it. Thus, as with a wavefront ripple, flare from multiple reflections is not considered in the prior art OPC. The reasons are similar, i.e., stray reflections require extra effort to detect, they are largely generated outside the ROI, and their contribution to the image is not handled by conventional algorithms of lithographic image simulation.

Stray reflections are dim, and generally represent an acceptable loss in image intensity. Thus, stray reflections are not particularly deleterious unless they actually illuminate the wafer with stray light. For this to occur, it is usually necessary for two surfaces to participate in the stray light path, one surface to back-reflect a small portion of the primary imaging beam, and another to redirect some of the stray reflection forward towards the wafer. In nearly all cases, this light is strongly out of focus, and amounts to a pure background. In contrast, stray image light which is reflected back from the wafer and then forwarded from the underside of the mask remains reasonably well imaged at the wafer itself. For this reason, light in the primary image which is back-reflected along this particular path (wafer to mask, and back to the wafer) is usually not counted as stray light (particularly if, as is usually the case, the twice-through beam is weak compared to the direct image). In contrast, light following other stray paths will form a defocused background at the wafer. Such an unpatterned background has a non-negligible impact even at a 1% level.

Nowadays the reflectivity of the mask and wafer are held well below 100% (typically, an order of magnitude lower), but residual mask and wafer reflectivity are themselves typically an order of magnitude greater than the residual reflectivities of the lens element surfaces (which can be made highly transmissive). Nonetheless, the cumulative impact of all stray reflection paths which involves two successive stray reflections from lens surfaces are roughly comparable to the cumulative impact of those paths which involves only a single lens reflection (together with a single reflection from the mask or the wafer). This heightened cumulative impact is simply the result of the large number of lens surfaces (e.g., about 50) that are present in state of the art lithography lenses.

In principle, stray reflections do the most damage if focused or almost focused at the primary image plane, but in practice, this instance (unlikely to begin with) is checked for and avoided by lens designers. Stray reflections thus tend to be defocused for large distances, i.e., distances corresponding to the macroscopic scale of characteristic lens dimensions. As a result, the flare kernel from stray reflections is significantly flat on the scale of lens resolution, or even on the scale of typical flare measurement patterns. This behavior allows the contributions to the flare kernel from stray reflections and wavefront ripple to be distinguished from one another, since the latter falls off quite rapidly at distances larger than the lens resolution, e.g., as the inverse second or third power of distance, while the former falls off only slowly.

However, the contribution of the stray reflection is effectively constant over approximately 500 mm scale of the measurement site.

Figure 5:
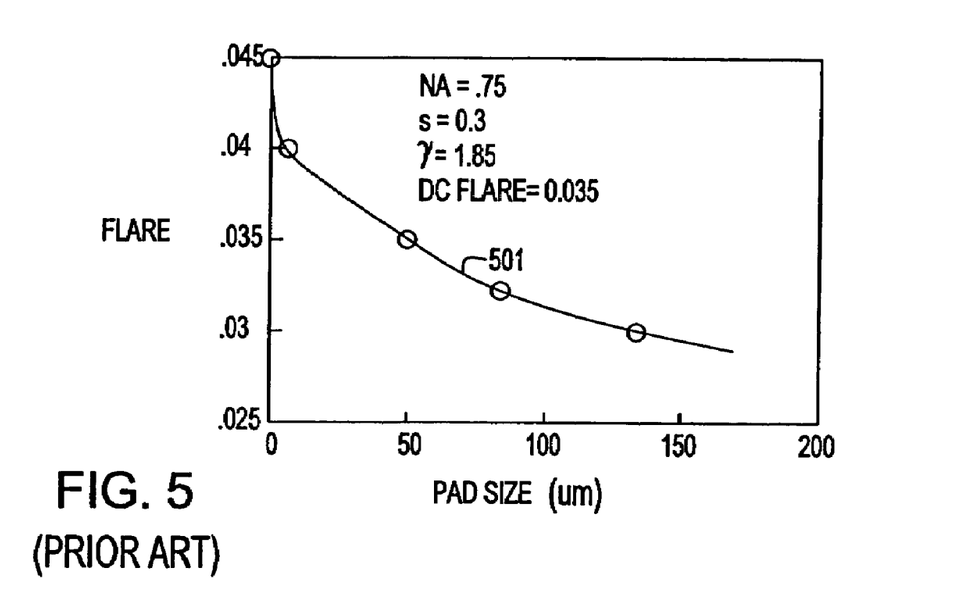
FIG. 5 is a prior art graph showing the evidence of the Power Law Kernel where a flare is plotted against the pad size.

It is generally observed that the flare energy from a wavefront ripple follows approximately the inverse power law relationship given by: $F(x) = K/(x-x')^\gamma$. This is shown in FIG. 5. Therein, the extent of flare is plotted in curve 501 for a typical optical process of a numerical aperture (NA) of 0.75 and a pupil size (σ) of 0.3. Under this condition, the power law shows γ=1.85.

Conventionally, design rule for mask design is derived from consideration of short range optical interaction due to diffraction of light. These rules only deal with edges within a certain optical radius, typically smaller than 1 um from the pattern edge in consideration. However flare is long range in nature (>>1 µm) and contribution from a large distance away is significant. Such a rule will depend on the local pattern density around the edge in consideration. The random pattern density across the full chip will cause additional ACLV error.

Currently, there is no systematic and scientific approach in the current art on how to quantify the effect of flare into devising a rule for the designer to follow under the assumption that any design scenario can happen in any full chip design. Also, currently there are no available tools for generating design rules incorporating flare effects, and there are no know publications to that effect. The present invention satisfies the need for generating design rules which accurately incorporates the effect of flare.

In patent application Ser. No. 10/844,794 of common assignee, which is herein incorporated by reference, a method of performing an optical proximity correction (OPC) using flare is described. This approach is based on computing the image intensity at a predetermined point having both diffraction and flare based intensities. However, this methodology is applicable only after a mask design is made and is computationally very expensive.

OBJECTS OF THE INVENTION

Accordingly, it is an object of the present invention to provide a method for generating design rules that take into account the intermediate and long-range image contributions of an optical lithographic process.

It is another object to create design rules in a mask layout that incorporate therein the intermediate and long-range image contributions of the optical lithographic process.

It is a further object to provide a method that determines the enclosed energy due to the intermediate and long-range image contributions of the optical lithographic process.

It is still a further object to provide a region in the mask layout for the most critical structures of the mask such that they are not affected by the intermediate and long-range image contributions of the optical lithographic process.

It is a yet another object to provide a region in the mask layout for the placement of shapes that are known to exacerbate the problem created by the intermediate and long-range image contributions of the optical lithographic process.

It is a more particular object to provide a method that satisfies the limitations imposed on variations of the critical dimensions of the shapes on a photo-lithography wafer caused by flare in an optical lithographic process.

SUMMARY OF THE INVENTION

These and other objects, aspects, and advantages of the invention are provided by a method for incorporating design tolerances in the design of a mask that account for any distortions in the photo-lithography process due to optical flare. In so doing, the invention computes the enclosed optical energy factoring in long-range flare effects. This computation depends on the maximum optical energy emanating from a selected region of the mask, and includes the contributions of the optical flare from all the shapes within the mask layout in the selected region, and stray lights due to the optical lithographic process.

In one aspect of the invention, computation of the maximum enclosed energy affecting the critical dimension of the mask shape depends on the pattern density of the surrounding regions and the distance from a given mask shape having the critical dimension, to a region having the predetermined pattern density.

The present invention also provides a method of computing the maximum pattern density of a region surrounding a mask feature with a critical dimension that includes the steps of: a) selecting a mask shape having a critical dimension and providing a tolerance on variations of the given critical dimension; b) building a physical model of conforming to the optical lithography process; c) using the above physical model for computing energy enclosed within a surrounding region at a predetermined distance; and d) computing and outputting the maximum pattern density of the given surrounding region at the predetermined distance which maintains the critical dimension of the given mask shape within the given tolerance.

The present invention further provides a method of computing the minimum distance of a region having a given pattern density which is surrounding a mask feature with a critical dimension that includes the steps of: a) selecting a mask shape having a critical dimension and providing a tolerance on variations of the given critical dimension; b) building a physical model conforming to the optical lithography process; c) using the above physical model for computing the energy enclosed within a surrounding region having a predetermined pattern density; and d) computing and outputting the minimum distance from the given mask shape having a critical dimension to the surrounding region having said predetermined pattern density distance which maintains the critical dimension of the given mask shape within the given tolerance.

The invention further provides a method wherein the physical model of flare is quantified as the inverse power-law kernel, with the surrounding region given as an annulus. The computation of the inverse power law kernel includes the steps of: a) determining a nominal exposure for the critical dimension and at least one value of the nominal exposure producing a critical dimension which is at least 90% of the critical dimension, and at least one value of exposure that produces a critical dimension that at most 110% of the critical dimension; b) determining an exposure latitude using the values of exposure; c) defining a nominal variation of critical dimension; d) determining a nominal value of flare from the nominal variation of the critical dimension and the exposure latitude, and e) using the nominal value of flare to compute the inverse power law kernel.

The invention also provides a methodology wherein the computation of the maximum pattern density of a region in which the distance from a mask shape with critical dimension is predetermined, includes the steps of: a) specifying a minimum distance of shapes having the at least one critical dimension; b) generating at least one graph plotting the at least one critical dimension versus the pattern density, at a predetermined distance; c) using the maximum tolerance for the critical dimensions, selecting a rule efficient region for the at least one graph; and d) using the rule efficient region, outputting the maximum pattern density.

BRIEF DESCRIPTION OF THE DRAWINGS

The accompanying drawings, which are incorporated in and which constitute part of the specification, illustrate presently preferred embodiments of the invention and, together with the general description given above and the detailed description of the preferred embodiments given below serve to explain the principles of the invention.

FIG. 1 shows various examples of conventional design rules, such as minimum width of a channel, minimum distance between two corners, minimum distance between two features, and the like.

DETAILED DESCRIPTION

In describing the preferred embodiment of the present invention, reference will be made hereinafter to FIGS. 6 through 14, in which like numerals refer to like features of the invention.

The invention is related to generating design tolerances in a mask design that account for distortions in the photo-lithography process caused by optical flare. In so doing, it computes the enclosed optical energy that incorporates long-range flare effects. The invention is ultimately used in the design of a mask layout for the manufacturing of VLSI chips.

The present invention provides a significant improvement beyond the prior art as illustrated, e.g., in FIG. 2, in the generation of design rules (also known as ground rules). In order to improve the derivation of design rules, the invention considers the effect of flare emanating from all the shapes on the mask as opposed to a small region considered in the prior art.

The present invention provides two types of design rules that incorporate flare effects. One of the design rules specifies the maximum pattern density that is permitted within a given region. The other design rules specify the minimum distance allowed for a particular shape having a given pattern density within a region having critical dimensions (CD). Both of these design rules depend on acceptable variations of the Critical Dimension (CD) for a given shape or feature. These acceptable variations are often required to be confined within an allowable tolerance level of the CD which is also defined as the Across Chip Line Variations (ACLV). The ACLV is determined by the performance specifications of a particular VLSI circuit.

Figure 6:
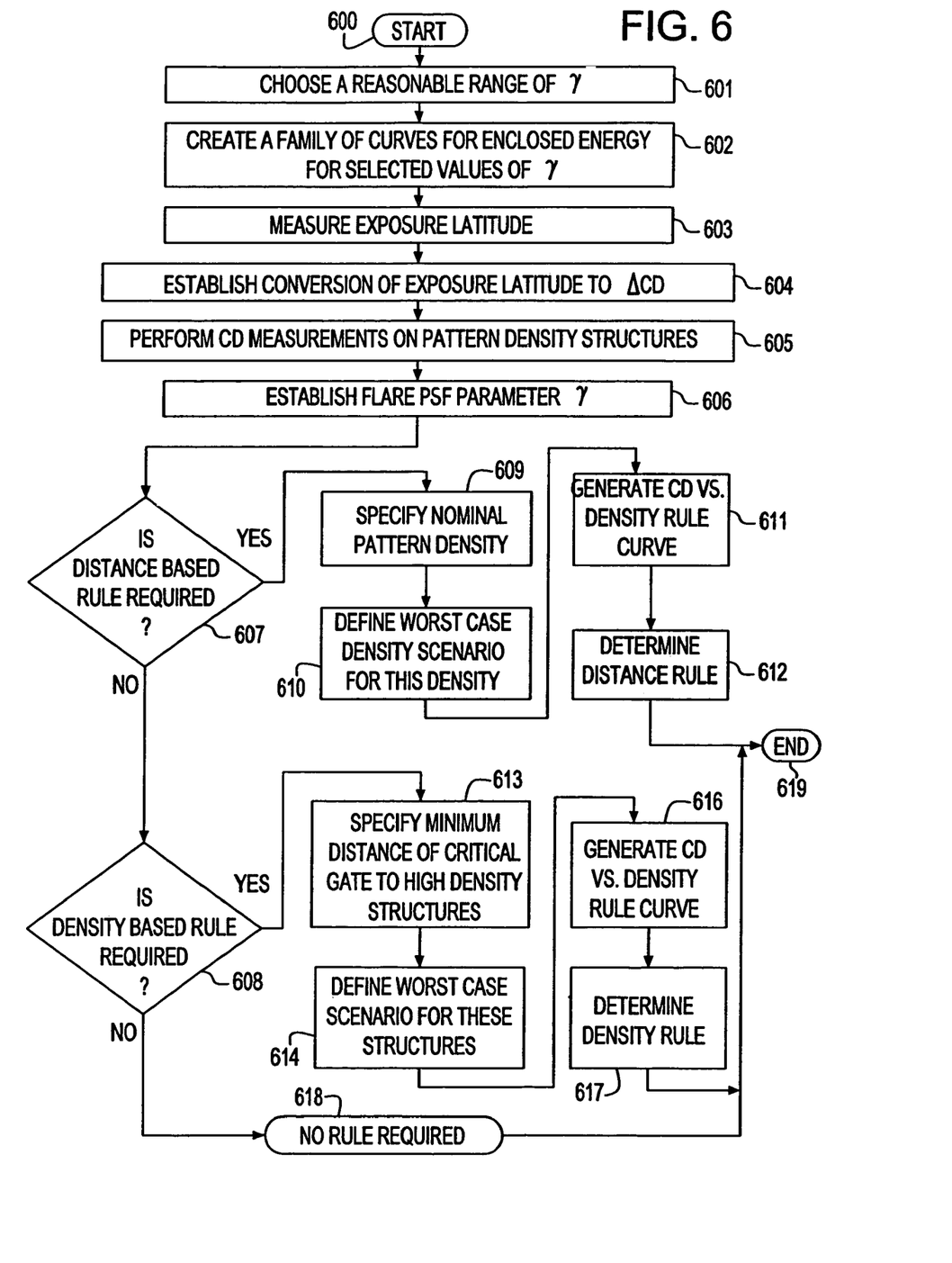
FIG. 6 is a flow chart illustrating the various method steps illustrating an embodiment of the present invention.

The present invention is described in terms of the flow diagram shown in FIG. 6. The flare is computed as the inverse power law kernel $F(x)=K/(x-x')^\gamma$, wherein x represents the distance scale and the characteristics of flare is represented by the value of γ. For a typical optical lithographic process γ may vary between 1.5 and 3.0.

In 601, a reasonable range $(r_1, r_2)$ of γ is chosen such that the range is bound by 1.5 and 3.0.

In 602, a family of power law curves is created for values of γ within the range $(r_1, r_2)$ in steps of δr. The value of δr is selected to vary between 0.05 and 0.1. Shown in FIG. 7, a plurality of power law curves are depicted for values of γ between 1.7 and 2.45. The current invention computes the amount of flare that affects the CD variation of a selected shape in terms of the enclosed energy of that region. The enclosed energy can be defined as the flare component of the optical energy that emanates from a given region of the mask. In the present embodiment, the enclosed energy for a given region is computed by convolving the inverse power law kernel with the pattern density corresponding to that region.

The basic concept of an enclosed energy will now be explained with reference to the family of graphs shown in FIG. 7. The number of curves illustrated therein represents only a subset of curves generated in step 602. These curves show only the amount of optical energy from the flare kernel before it is convolved with the mask shapes.

Figure 7:
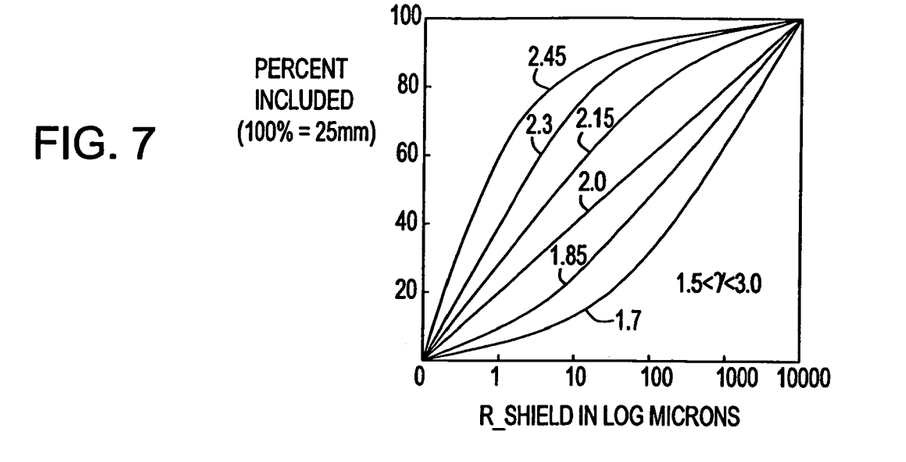
FIG. 7 is a graph plotting the sum of the optical energy contributed by the flare within a given distance from a critical feature.

The graphs depicted in FIG. 7 represent the total of the flare component of the optical energy contribution within a certain distance from a critical feature. By way of example, the curve corresponding to γ=2 shows that the sum of the optical energy increases uniformly with the logarithm of distance scale. Alternatively, for values of γ<2, the sum of the optical energy increases more rapidly as the distance increases. Thus, for γ<2, the flare component of the optical energy remains high even within the distance scale. On the other hand, for γ>2, the sum of the optical energy increases less rapidly as the distance increases. Thus, if γ>2 the flare component of the optical energy diminishes rapidly with the distance scale.

The value of γ depends on the lens and other parameters of the optical tool and is independent of the mask layout. In the present invention, γ is computed using the Exposure Meandering process (steps 603 through 606). On the basis of the CD measurements obtained in step 605, the flare kernel parameter γ is computed in step 606.

Figure 8A:
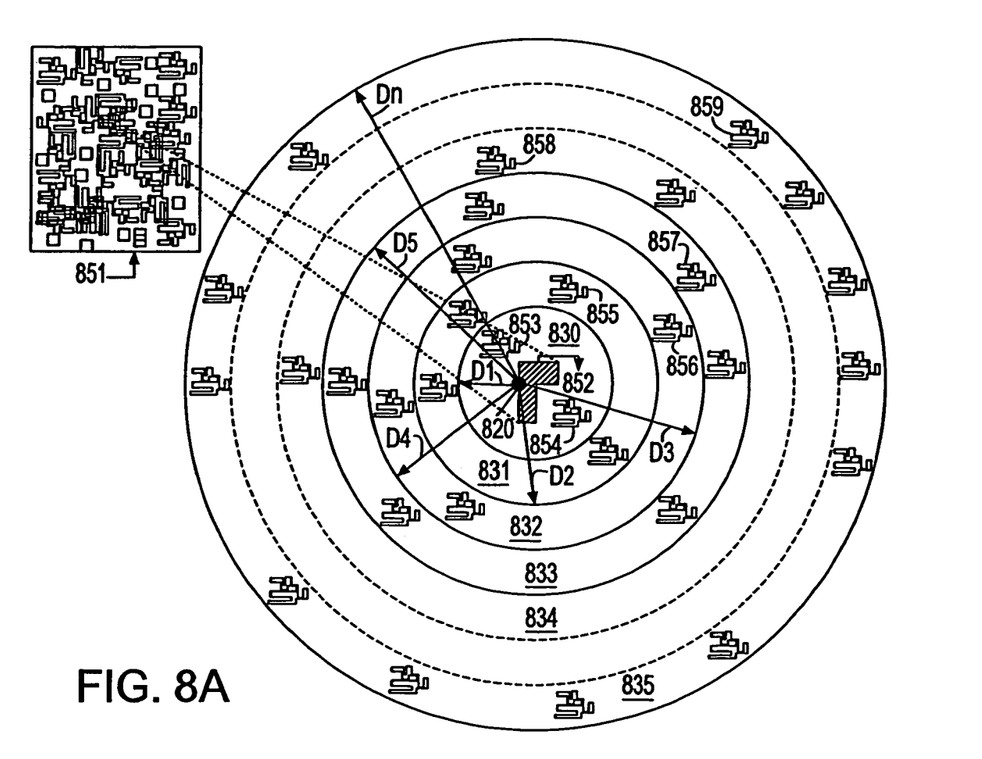
FIGS. 8A-8C illustrate various shapes positioned within several distance scale which are used to compute the enclosed optical energy.

The amount of optical energy on a particular shape, however, depends on both the value of γ and the pattern density of the mask. Whereas the prior art as shown, e.g., in FIG. 2, considers only short range interactions of the mask shapes, the present invention incorporates the interaction of all the mask shapes within the lithographic mask layout. This is shown in FIG. 8A, wherein 851 illustrates a typical mask layout with all the shapes within the mask. Also shown therein is a typical mask shape 852 enlarged for the purpose of gaining a better understanding. Numeral 820 represents the edge on the shape 852 that may require a design rule. In the present invention, the design rule is evaluated by considering shapes at many different distance scales. By way of example, regions 830, 831, 832, 834, . . . , 835 are respectively positioned at distances D1, D2, D3, D4, . . . , Dn.

Also shown in FIG. 8A are shapes lying within the smallest region 830, i.e., 852, 853, and 854. These shapes are used to compute the short range component of the image intensity at edge 820. In the current state of the art as depicted, e.g., in FIG. 2, only shapes within this short range interaction region are factored in for evaluating the design rules, in contrast with the present invention where the shapes at all the distance scales are considered.

Figure 8B:
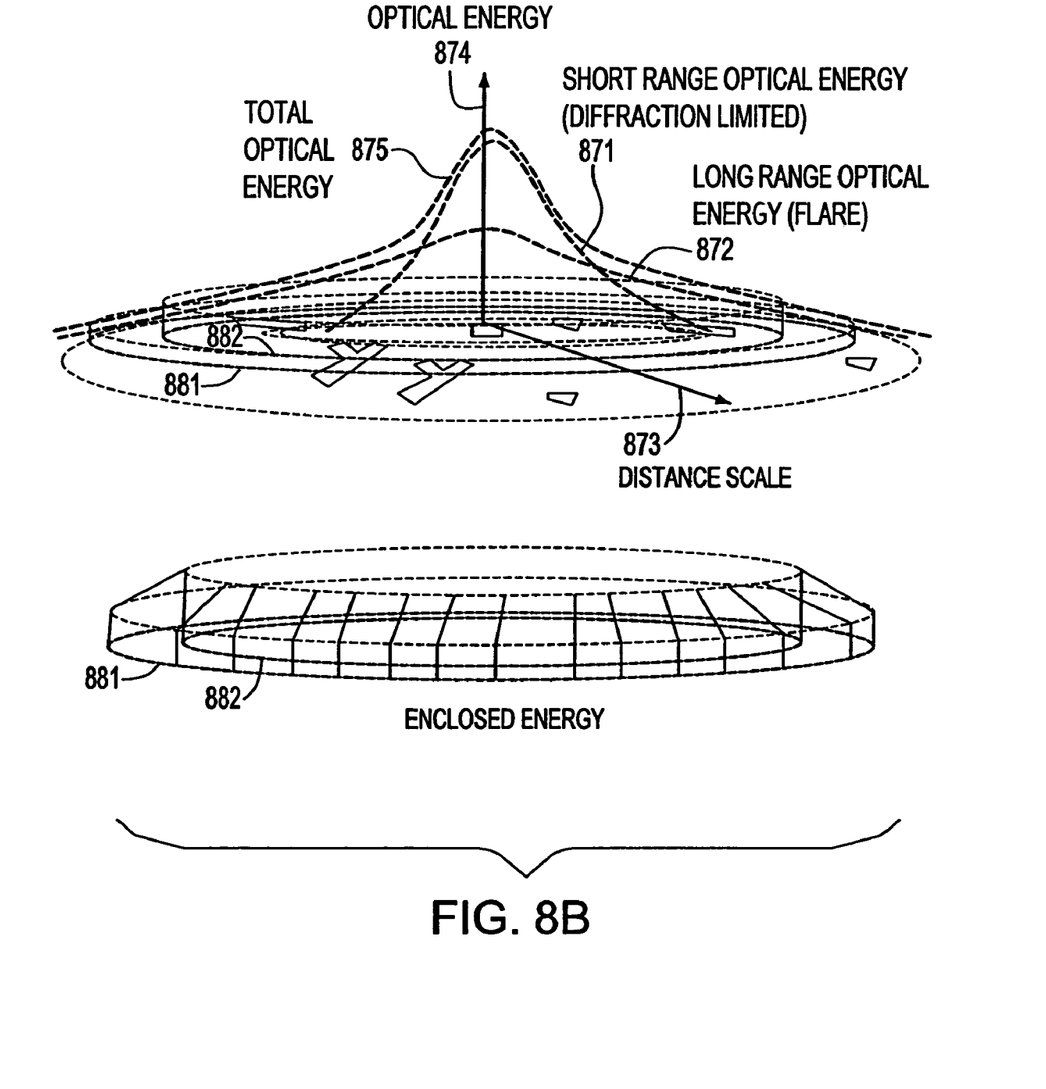

Differences between the inventive method and the prior art are further highlighted in FIG. 8B. At the top, different portions of the optical energy are plotted on a mask distance scale. The figure is not drawn to scale.

Still referring to FIG. 8B, the distance from a mask layout feature is shown as 873, and the optical energy, as 874. Numeral 871 illustrates the diffraction limited short range optical energy. (In the prior art, only the component of the optical energy is considered). Numeral 872 represents the long range or the flare portion of the optical energy. The total optical energy as shown in 875 is the sum of 871 and 872. The current invention considers the enclosed energy for the total optical energy.

The concept of an enclosed energy is shown in the lower portion of FIG. 8B confined within circles 881 and 882. It represents the total enclosed energy under the curve 875 up to a distance 881 minus the total enclosed energy under the curve 875, up to the distance 882.

Figure 8C:
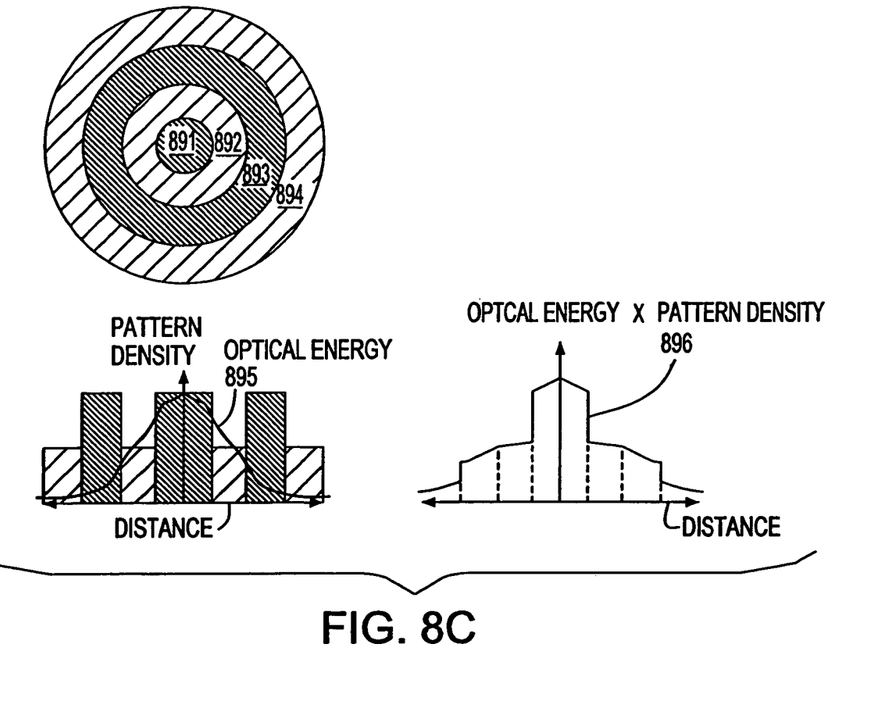

At any location of the mask, CD is affected by both the enclosed optical energy and the local pattern density. This is shown in FIG. 8C. Mask regions having a different pattern density are represented by concentric circles 891, 892, 893, and 894, wherein 891 and 893 have a pattern density ox, and 892 and 894, a pattern density β, where α>β. This is illustrated in the profile at the bottom left of FIG. 8C, in which the optical energy is represented by curve 895. The convolution of the pattern density and the optical energy is depicted by curve 896, shown in the bottom right portion of FIG. 8C.

Figure 9:
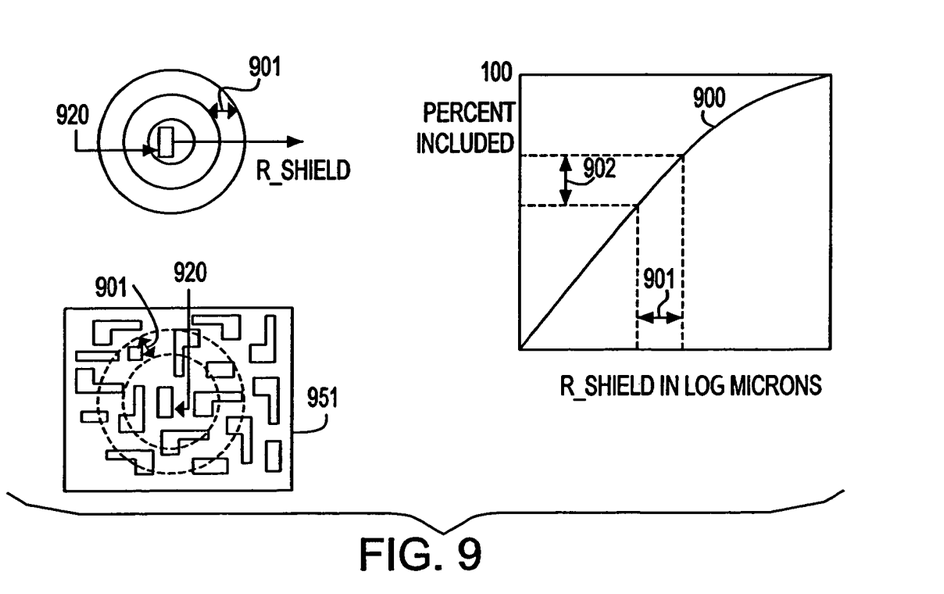
FIG. 9 illustrates the concept of an enclosed energy by way of a plot for a selected value of γ in which the distance scale is plotted on the x-axis and the percentage value of the enclosed energy is plotted on the y-axis.

The concept of an enclosed energy is further demonstrated in FIG. 9. A plot for the chosen value of γ is drawn on the right (900). For that value of γ, the distance scale is plotted on the x-axis (901). For that value of the distance scale, the corresponding values on the y-axis (902) provides the percent enclosed energy. A portion of a typical mask layout is shown in 951, in which 920 is a shape for which design rules need to be evaluated. For feature 920 and distance scale 901 (see the bottom left portion of FIG. 9), the enclosed energy is computed by convolving the shapes enclosed within the annulus of 901 with the enclosed sum of the energy of 902 (seen in the right portion of FIG. 9)

In step 603, the exposure latitude is measured using Exposure Meandering, the latter being specified by an initial dose and step increment.

Given a mask feature whose nominal critical dimension is referenced as $CD_{nom}$ and which is created at a nominal exposure $E_{nom}$, the exposure latitude is defined as:

$$EL = |E2 - E1|/(E2 + E1)*100\%$$

where E2 is the dose necessary for achieving a critical dimension that is 110% of $CD_{nom}$, and E1 is the dose for achieving a critical dimension that is 90% of $CD_{nom}$.

The above process, referred to Exposure Meandering, is defined as a lithographic process wherein a series of exposures of the same mask design pattern positioned at different locations of the mask are taken. Each exposure is taken with different dose values.

In 604, the measured exposure latitude is converted to ΔCD by assuming a linear relationship between CD and dose E, which is a good approximation near nominal CD at $CD_{nom}$.

$$\Delta CD = EL * \text{flare}_{nom}$$

The $\text{flare}_{nom}$ is the nominal flare for the process.

In 605, CD measurements are performed on pattern density structures. On the basis of the CD measurements obtained in step 605, the flare kernel parameter γ is computed in step 606.

The current invention provides two types of design rules: a) density based rules and, b) distance based rules. The density based design rules are invoked when distance requirements are required. On the other hand, distance based rules are applied for a predetermined density of shapes or features. An example of the latter is decoupling capacitors (also referred to as decaps) which are usually very high density structures. Since the density of these structures cannot change, a distance based rule is desired.

In step 607, it is decided whether a distance based design rule is desired. If the answer is YES, the process branches to step 609, wherein the nominal pattern density of the layout design is specified. The pattern density is defined as the ratio of the area covered with chrome to the clear area of the layout mask. The nominal pattern density of a typical mask varies between 20 and 40%. On the other hand, a high density region, such as the location having a bank of decoupling capacitors (decaps), may have a local pattern density as high as 80%.

In step 610, the worst case scenario of the mask in terms of pattern density is defined in terms of the worst case local density of specific structures, such as decaps. The pattern density of a decap may reach 65%. The average pattern density of a typical layout varies between 15 and 25%.

In Step 611, a ΔCD vs. distance rule curve is generated using the equation $$\Delta CD = EL * \text{Mask}_{sc}(r) \otimes F(r),$$

wherein $\text{Mask}_{sc}$ is mask layout of the worst case scenario, and F, the flare kernel.

Figure 10:
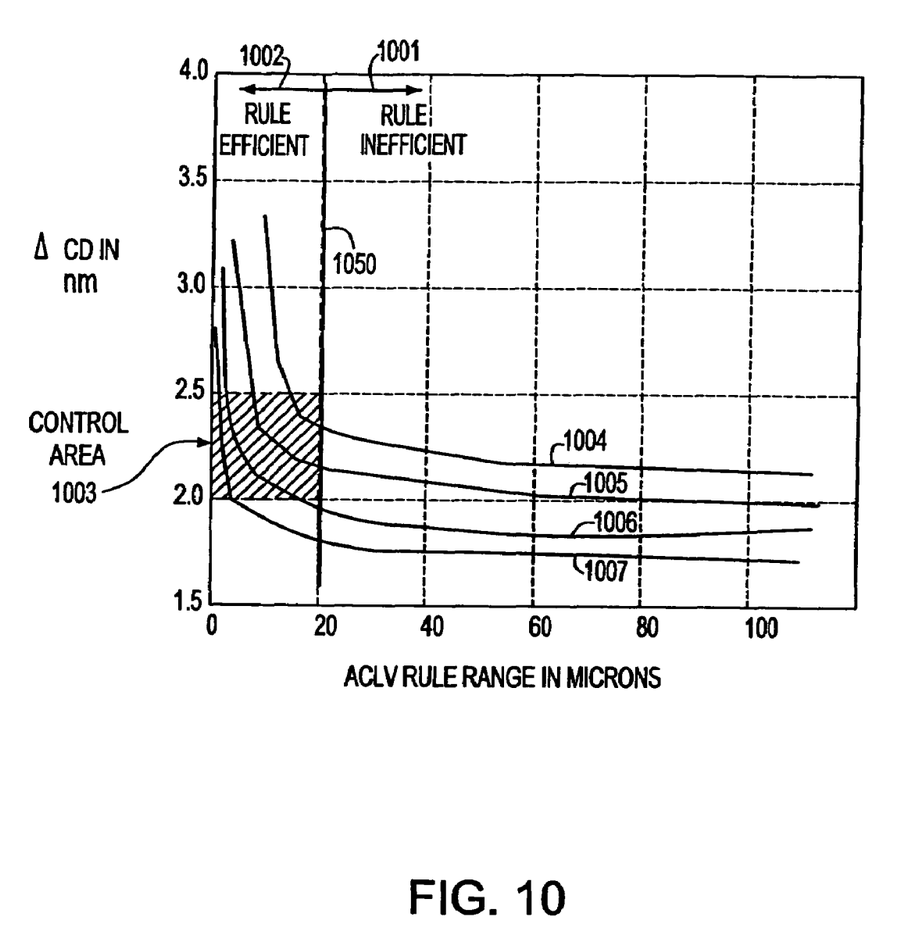
FIG. 10 is a graph illustrating the variation of the critical dimension (CD) for different pattern densities as a function of distance (x-axis) to which the design rule is to be applied versus the applicable tolerance f the variations of the critical dimension (y-axis).

A set of such curves is shown in FIG. 10. Therein, the x-axis shows the distance range for which the design rule needs to be applied. The y-axis represents the applicable tolerance for variations on the Critical Dimension or the ΔCD. The curves 1004 through 1007 illustrate ΔCD for different pattern density scenarios. The pattern density for 1004 is the highest, and the pattern density for 1007 is the lowest. All these curves are drawn for the same value of γ.

The ACLV Rule region is divided in two regions separated by line 1050. Line 1050 is drawn by a user defined parameter $\sigma_1$ which defines the slope of the aforementioned curves. In the region 1001 at the right of line 1050, the curves 1004 through 1007 have very small slope, smaller than $\sigma_1$. Within this region, any amount of change in the design rule does not cause any significant change of ΔCD. This region is referred to as the rule inefficient region. In region 1002 at the left of line 1050, the curves 1004 through 1007 have a slope greater than $\sigma_1$. Within this region, any small change in the design rule causes significant changes in ΔCD. The user defines an allowable range for ΔCD. Using this allowable range, a control region for these curves (e.g., 1003) is created. The aforementioned control region defines the distance based design rule for the next step.

Figure 11:
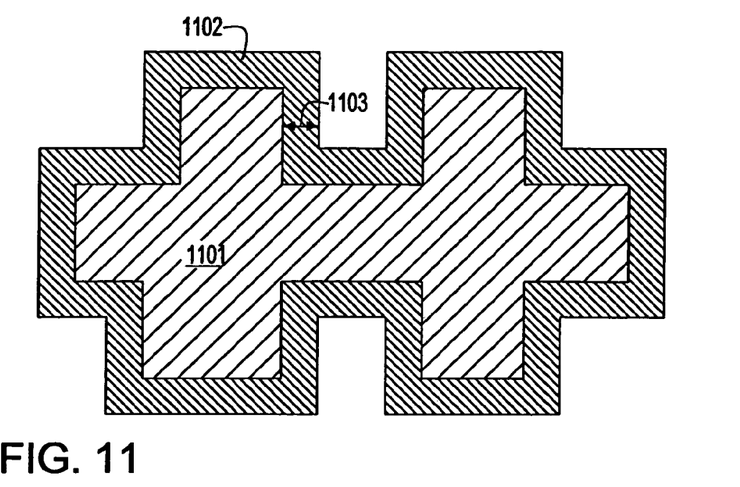
FIG. 11 illustrates how the distance rule is applied to protect the critically dimensioned features with a band of structures provided with the defined pattern density.

In Step 612, the distance based design rule is obtained by using the curves and the control region generated in Step 611. The distance rule can be stated in any form. However, the essence of the distance rule is to protect the critically dimensioned features with a band of structures provided with the defined pattern density. This is illustrated in FIG. 11, wherein 1101 shows a region of features having the stated critical dimensions, and 1102 shows a band that surrounds 1101 at a predetermined distance δ. The design rule requires that the pattern density in region 1102 does not exceed π obtained from Step 611.

If the answer to the query in Step 607 is NO, then the program branches to Step 608. At this point, a new query is made to determine whether a density based rule is required. If the reply is NO, then no rule is generated (Step 618) and the process terminates in step 619. If the answer to the query is YES (Step 607), then the density based rules are determined in steps 613 through 617.

In Step 613, the minimum distance of the features with critical dimensions to the features having the highest density is specified. This is a user defined parameter.

Figure 12:
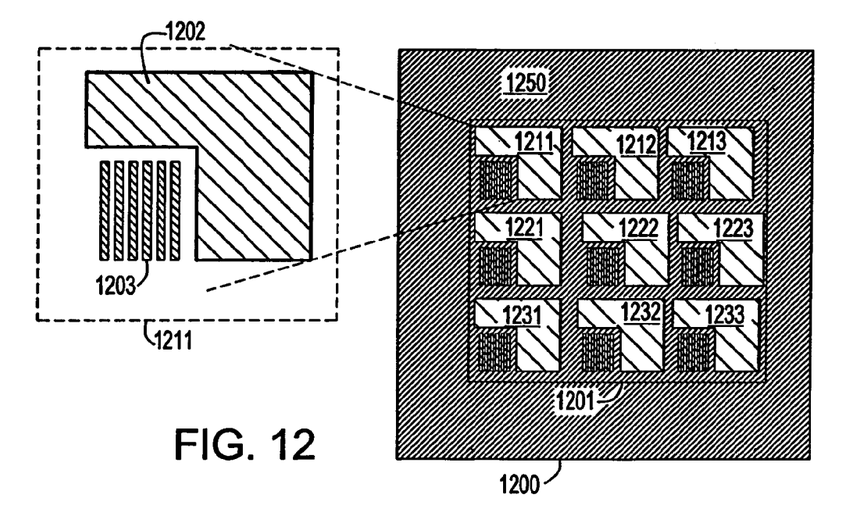
FIG. 12 illustrates an instance of a worst case scenario in terms of the highest density structures.

In Step 614, the worst case scenario is defined in terms of the highest density structures. An example of this worst case scenario is described in FIG. 12. Therein is shown a portion of the mask layout 1200. This layout displays at the center thereof an array of decaps 1201 surrounded by other mask patterns with average pattern density (1250). One of the decaps (1211) is shown on the left in greater details. Decap 1211 is provided with a portion having a high density structure 1202 and structures having critical dimensions 1203. 1201 has nine such decaps. The critical structure corresponding to 1231 is surrounded on two sides by a high density structure, and on the other two sides by low density structures. The critical structure corresponding to 1211, 1221, 1232 and 1233 are surrounded on three sides by the high density structure, and on only one side by the low density structures. The critical structure corresponding to 1212, 1213, 1222, 1223, are surrounded on all four sides by high density structures. These last four depict the worst case scenario.

Figure 13:
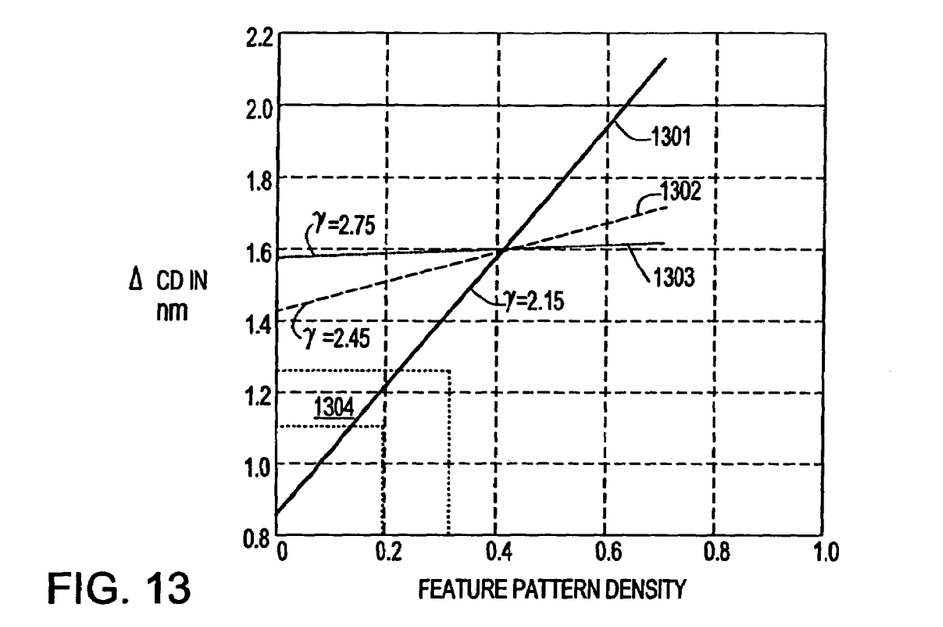
FIG. 13 shows three curves corresponding to three values of γ, wherein the x-axis represents the pattern density for which the design rule needs to be applied, and the y-axis, the applicable tolerance for variations of ΔCD.

In Step 616, a plot of $\Delta CD$ vs. density rule curve is generated. A set of such curves is illustrated in FIG. 13. Therein, the x-axis shows the pattern density for which the design rule needs to be applied. The y-axis illustrates the applicable tolerance for the variation on the Critical Dimension or $\Delta CD$. Three different curves are depicted for three different values of $\gamma$. 1301 is shown for $\gamma=2.15$, 1302 is shown for $\gamma=2.45$, and 1303 is shown for $\gamma=2.75$. The variation of $\Delta CD$ with pattern density is linear for a constant value of $\gamma$. Unlike the $\Delta CD$ vs. distance rule curves shown in FIG. 10, the entire graph can be considered as being rule efficient. Therefore, the control region is computed by the user defined $\Delta CD$ and the user defined maximum pattern density. By way of example, the control region for $\gamma=2.15$ is depicted as region 1304 (FIG. 13).

Figure 14:
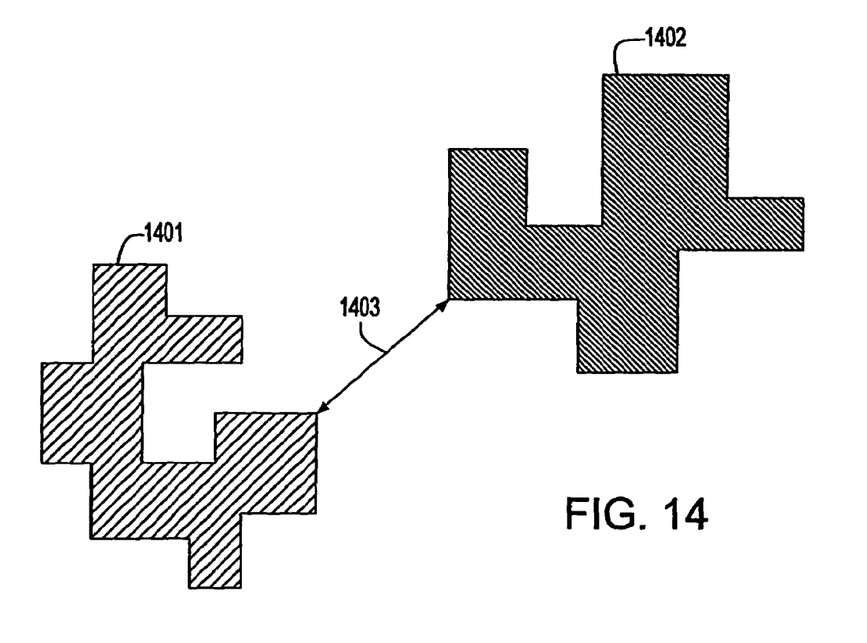
FIG. 14 shows a region depicting features having critical dimensions and a region having a pattern density that exceeds a user's specified value.

In Step 617, the density based design rule is obtained using the curves and the control region generated in Step 616. The density rule can be stated in any form. However, the essence of the density rule is to ensure that any structure with a pattern density exceeding a certain user specified parameter $\pi$ must be at least $\delta$ away from the critical structures. This is shown in FIG. 14. Therein, 1401 represents a region of features having critical dimensions, and 1402, a region whose pattern density exceeds the user specified value of $\pi$. The design rule requires that the minimum distance 1103 between the regions 1101 and 1102 be at least $\delta$, as computed in Step 617.

If in step 608 there is no density based rule required, then in step 619 the program comes to an END with no rule being generated (Step 618).

The present invention is ultimately implemented in a digital computer which main components are: a central processing unit (CPU), at least one input/output (I/O) device (such as a keyboard, a mouse, a compact disk (CD) drive, and the like), a controller, a display device, a storage device capable of reading and/or writing computer readable code, and a memory—all of which are connected, e.g., by a bus or a communications network.

The present invention can further be implemented as a computer program product stored on a computer readable medium, such as a tape or CD. The computer program product contains instructions to implement the method according to the present invention on a digital computer. Finally, the present invention can also be implemented in a plurality of digital computers where the present items may reside in close physical proximity or distributed over a large geographic region and connected by a communications network.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for generating rules for a mask layout design of a Very Large Scale Integrated Circuit (VLSI) chip, said chip layout consisting of a plurality of layers, each of said layer having predetermined critical dimensions, predefined optical lithography process and at least one mask, said critical dimensions having predetermined tolerances, the method comprising:
   a. forming at least one shape for said at least one mask and determining whether there is at least one region of the mask affecting said critical dimensions;
   b. if at least one of said regions is found, determining a maximum energy emanating from said at least one region that maintains the critical dimension of said shape within said tolerance;
   c. creating a corresponding rule for said region that characterizes an actual energy emanating from said region is at most equal to said maximum energy; and
   d. constructing the chip layout with said rule assigned to said region.

2. The method as recited in step d) of claim 1 wherein said rule provides a maximum pattern density for said region.

3. The method as recited in step d) of claim 1 wherein said rule provides a minimum distance of said region from said mask shape having said critical dimension.

4. The method as recited in claim 2, wherein said region is at a predetermined distance from said mask shape having said critical dimension.

5. The method as recited in claim 3, wherein said region is provided with a predetermined pattern density.

6. A method for generating rules for a mask layout design of a Very Large Scale Integrated Circuit (VLSI) chip, said chip layout consisting of a plurality of layers, each of said layer having predetermined critical dimensions, predefined optical lithography process and at least one mask, said critical dimensions having predetermined tolerances, the method comprising:
   a) forming at least one shape for said at least one mask having a critical dimension and having at least one surrounding region at a predetermined distance;
   b) building a physical model of at least one component of the energy contributed by said at least one surrounding region at a predetermined distance from said at least one shape having said critical dimension;
   c) using said physical model, determining a maximum energy enclosed within said surrounding regions at said predetermined distance;
   d) determining the maximum pattern density of said surrounding regions at said predetermined distance characterized by said computed maximum energy that maintains the critical dimension of said shape having said critical dimension within said tolerance;
   e) creating a corresponding rule for said maximum pattern density, for said surrounding; and
   f) constructing the chip layout with said rule assigned to said region.

7. The method as recited in claim 6, wherein amounts of optical energy on said shape depends on a power coefficient $\gamma$, on said pattern density and on an interaction of all mask shapes contained within said mask layout.

8. A method for generating rules for a mask layout design of a VLSI chip, said chip layout consisting of a plurality of layers, each of said layer having predetermined critical dimensions, predefined optical lithography process and at least one mask, said critical dimensions having predetermined tolerances, the method comprising:

a) creating at least one shape for said at least one mask having a critical dimension and having at least one surrounding region having a predetermined pattern density;
b) building a physical model of at least one component of energy contributed by said surrounding regions having a predetermined pattern density;
c) using said physical model, determining a maximum energy enclosed within said surrounding regions having said predetermined pattern density;
d) determining a minimum distance from said shape having a critical dimension to said surrounding regions having said predetermined pattern density that maintains the critical dimension of said shape having said critical dimension within said tolerance;
e) creating a corresponding rule for said maximum pattern density for said surrounding; and
f) creating the chip layout with said rule assigned to said region.

9. The method as recited in claim 8, wherein said physical model for said energy is computed as an inverse power law kernel.

10. The method as recited in claim 9, wherein flare energy from a wavefront ripple approximates equation $$F(x)=K/(x-x')^\gamma$$

wherein γ said power law coefficient is bound between 1.5 and 3.0.

11. The method as recited in claim 10, wherein for an optical process having a numerical aperture (NA) of 0.75 and a pupil size (σ) of 0.3, the value of γ provided by said power law kernel equals 1.85.

12. The method as recited in claim 8, wherein said region at said predetermined distance is an annulus.

13. The method as recited in claim 6, wherein said enclosed energy is computed by convolving the shapes contained within said annulus with the sum of the incidental optical energies contained within said annulus.

14. The method as in claim 9, wherein said inverse power law kernel further comprises:
a) determining a nominal exposure for said critical dimension and at least one value of said nominal exposure producing a critical dimension which is at least 90% of said critical dimension, and at least one value of exposure that produces a critical dimension that at most 110% of said critical dimension;
b) determining an exposure latitude using said values of exposure;
c) defining a nominal variation of a critical dimension;
d) determining a nominal value of a flare from said nominal variation of said critical dimension and said exposure latitude; and
e) using said nominal value of flare to determine said inverse power law kernel.

15. The method as recited in step c) of claim 8, wherein said computing of said maximum pattern density of at least one of said surrounding regions at said predetermined distance comprises:
a) specifying a minimum distance of shapes having said at least one critical dimension;
b) generating at least one graph plotting said at least one critical dimension versus the pattern density at a predetermined distance;
c) selecting a rule efficient region for said at least one graph using said maximum tolerance for said critical dimension; and
d) determining said maximum pattern density using said rule efficient region.

16. The method as recited in step d) of claim 8, further comprising:
a) specifying a nominal pattern density and a maximum tolerance for said critical dimension;
b) generating at least one graph plotting said at least one critical dimension versus distance of the pattern density of at least one surrounding;
c) selecting a rule efficient region for said at least one graph using said maximum tolerance for said critical dimension; and
d) determining said minimum distance using said rule efficient region.

17. The method as recited in step c) of claim 11, wherein computing said rule efficient region farther comprises the steps of:
a) defining at least one minimum slope for said at least one graph;
b) computing the slope of said at least one graph plotting said critical dimension versus pattern density for a predetermined distance;
c) identifying a region of said graph having a slope greater than said minimum slope; and
d) having said region become a rule efficient region.

18. The method as recited in claim 12, where in the step of computing the rule efficient region farther comprises:
a) defining at least one minimum slope for said at least one graph;
b) computing the slope of said at least one graph plotting said critical dimension versus distance from a shape having said critical dimension to said at least one surrounding region having said predetermined pattern density;
c) identifying a region of said graph having a slope greater than said minimum slope; and
d) having said region become a rule efficient region.

19. A program storage device readable by a machine, tangibly embodying a program of instructions executable by the machine to perform method steps for generating rules for a mask layout design of a VLSI chip, said chip layout consisting of a plurality of layers, each of said layer having predetermined critical dimensions, predefined optical lithography process and at least one mask, said critical dimensions having predetermined tolerances, said method steps comprising:
a. forming at least one shape for said at least one mask and determining whether there is at least one region of the mask affecting said critical dimensions;
b. if at least one of said regions is found, determining a maximum energy emanating from said at least one region that maintains the critical dimension of said shape within said tolerance;
c. creating a corresponding rule for said region that characterizes an actual energy emanating from said region is at most equal to said maximum energy; and
d. constructing the chip layout with said rule assigned to said region.

20. A program storage device readable by a machine, tangibly embodying a program of instructions executable by the machine to perform method steps for generating rules for a mask layout design of a VLSI chip, said chip layout consisting of a plurality of layers, each of said layer having predetermined critical dimensions, predefined optical lithography process and at least one mask, said critical dimensions having predetermined tolerances, said method steps comprising:
a) forming at least one shape for said at least one mask having a critical dimension and having at least one surrounding region at a predetermined distance;

b) building a physical model of at least one component of the energy contributed by said at least one surrounding region at a predetermined distance from said at least one shape having said critical dimension;
c) using said physical model, determining a maximum energy enclosed within said surrounding regions at said predetermined distance;
d) determining the maximum pattern density of said surrounding regions at said predetermined distance characterized by said computed maximum energy that maintains the critical dimension of said shape having said critical dimension within said tolerance;
e) creating a corresponding rule for said maximum pattern density, for said surrounding; and
f) constructing the chip layout with said rule assigned to said region.

* * * * *